US005387112A

United States Patent [19]

Chishima

[11] Patent Number: 5,387,112

[45] Date of Patent: Feb. 7, 1995

[54] VERSATILE TERMINAL MEMBERS FOR RIBBON CABLE CONNECTORS

[75] Inventor: Masamitsu Chishima, Yokkaichi, Japan

[73] Assignee: Sumitomo Wiring Systems, Ltd., Yokkaichi, Japan

[21] Appl. No.: 99,562

[22] Filed: Jul. 30, 1993

[30] Foreign Application Priority Data

Sep. 16, 1992 [JP] Japan ............................ 4-064513[U]

[51] Int. Cl.[6] ............................................. H05K 1/00

[52] U.S. Cl. .................................... 439/67; 439/413

[58] Field of Search ...................... 439/59, 62, 65, 326, 439/630, 636, 637, 516, 492

[56] References Cited

U.S. PATENT DOCUMENTS

| | | | |
|---|---|---|---|
| 4,136,917 | 1/1979 | Zhem et al. | 439/326 |
| 4,734,053 | 3/1988 | Imai . | |
| 4,832,617 | 5/1989 | Brown . | |
| 4,872,845 | 10/1989 | Korunsky et al. | 439/516 |
| 4,978,315 | 12/1990 | Edgley et al. | 439/516 |
| 5,009,611 | 4/1991 | Regnier | 439/326 |
| 5,062,813 | 11/1991 | Liu et al. | 439/516 |
| 5,078,611 | 1/1992 | Tanigawa et al. . | |

FOREIGN PATENT DOCUMENTS

| | | |
|---|---|---|
| 0440016 | 7/1991 | European Pat. Off. . |
| 4-34880 | 2/1992 | Japan . |
| 902969 | 8/1962 | United Kingdom . |
| 1136649 | 12/1968 | United Kingdom . |
| 1508507 | 4/1978 | United Kingdom . |

OTHER PUBLICATIONS

English Language Abstract of Japanese Laid-Open Patent Publication No. 4-34880.

*Primary Examiner*—David L. Pirlot

*Attorney, Agent, or Firm*—Sandler Greenblum & Bernstein

[57] ABSTRACT

A versatile terminal members useable in any type of ribbon cable connectors has a generally elongated stem, contact and positioning prongs extending generally parallel to each other from a generally intermediate portion of the stem in one direction, and a pair of lead elements extending generally parallel to each other from opposite ends of the stem in a direction counter to the one direction. One of the lead elements is adapted to be trimmed off from the stem depending on the type of ribbon cable connector in which the very terminal member is to be mounted. A terminal array is also provided which comprises a series of the versatile terminal members which are connected together by means of a metal carrier strip at intervals of a predetermined pitch, but which can be separated from the metal carrier strip to provide the individual terminal members that can be subsequently trimmed to suit to a particular type of cable connectors.

3 Claims, 5 Drawing Sheets

VERSATILE TERMINAL MEMBERS FOR RIBBON CABLE CONNECTORS

CROSS REFERENCE TO THE RELATED APPLICATIONS

U.S. patent application Ser. No. 07/986,964 of Masamitsu Chishima, filed Dec. 8, 1992, and entitled "electric Connector for Flexible Ribbon Cable",

BACKGROUND OF THE INVENTION

1. Field of the Invention

The present invention generally relates to flexible ribbon cable connectors and, particularly, to versatile terminal members for use in the ribbon cable connectors. The present invention also relates to a terminal array comprising a series of generally bifurcated versatile terminal members which are regularly connected by means of a metal carrier strip, but which can be separated from the metal carrier strip to provide the individual terminal members that can be subsequently trimmed to suit to a particular type of the ribbon cable connector.

2. Description of the Prior Art

In various electric appliances, a diversity of electric cable connectors that differ in type, shape and size are employed. Of them, there is known a flexible ribbon cable connector, or a flat flexible cable connector, including one or more terminal members each having contact and positioning prongs and a lead element. The lead elements of the terminal members are soldered, or otherwise electrically connected, with circuit elements on, for example, a printed circuit board, while a flexible ribbon cable, or a flat flexible cable, having a plurality of electric conductors laid parallel to each other and bundled together into a generally ribbon-like configuration, can be inserted into the ribbon cable connector to permit some or all of the electric conductors to be electrically connected with the contact prongs of the terminal members.

To meet a high density integration of electric circuit elements on a support surface such as, for example, a printed circuit board, the ribbon cable connector of a type adapted to be mounted on the printed circuit board, generally referred to as a surface-mounting design, has come to be largely employed. With this ribbon cable connector of the surface-mounting design, the lead elements of the terminal members are soldered directly to contact pads on a surface of the printed circuit board with the ribbon cable connector held substantially immovable.

This ribbon cable connector of the surface-mounting design is generally divided into a number of categories: a straight type in which the flexible ribbon cable is inserted into the ribbon cable connector from top, i.e., in a direction generally perpendicular to the printed circuit board, and a right-angled type in which the flexible ribbon cable is inserted into the ribbon cable connector from lateral direction, i.e., in a direction generally parallel to the printed circuit board. The right-angled type can further be divided into a top-contact model, in which the contact and positioning prongs come to be positioned above and beneath the flat ribbon cable then inserted into the ribbon cable connector, and a bottom-contact model in which the contact and positioning prongs come to be positioned beneath and above the flat ribbon cable then inserted into the ribbon cable connector.

These diverse types of ribbon cable connectors employ the terminal members of different shape. For example, in the straight type, the ribbon cable connector may employ the terminal members having no lead elements; and in the right-angled type, the ribbon cable connector may employ the terminal members having only one lead element. Hitherto, a different shape of the terminal members are required for each type of the ribbon cable connector and, hence, a manufacturer must have stocks of terminal members of different shape so long as all of those types of ribbon cable connectors are manufactured and assembled. Also, when it comes to the manufacture of the terminal members of different shape, press dies for each shape of the terminal members must be made available. This requires not only a relatively large space for storage of the parts, but also a time-consuming and complicated job of taking an inventory of the parts, both resulting in a substantial increase of the manufacturing costs.

SUMMARY OF THE INVENTION

The present invention has been devised with a view to substantially eliminating the above discussed problems brought about by the requirement of the different shape of terminal members for each type of the ribbon cable connectors and is intended to provide a versatile terminal member which can be employed in any type of the ribbon cable connectors and also to provide a terminal array comprising a series of generally bifurcated versatile terminal members which can be separated from the metal carrier strip to provide the individual terminal members each ready to be subsequently trimmed to suit to a particular type of the cable connectors.

The terminal member herein provided in accordance with one aspect of the present invention is prepared by the use of any known press work subjected to a strip of rigid electric conductive material. The terminal member so prepared has a generally elongated stem, contact and positioning prongs extending generally parallel to each other from a generally intermediate portion of the stem in one direction, and a pair of lead elements extending generally parallel to each other from opposite ends of the stem in a direction counter to said one direction. One of said lead elements is adapted to be trimmed off from the stem depending on the type of ribbon cable connector in which the very terminal member is to be mounted.

According to another aspect of the present invention, there is provided a terminal array comprising a series of generally bifurcated terminal members which are regularly connected by means of a metal carrier strip at intervals of a predetermined pitch, but which can be separated from the metal carrier strip to provide the individual terminal members that can be subsequently trimmed to suit to a particular type of cable connectors. Each of the bifurcated terminal members connected together by means of the metal carrier strip a generally elongated stem, contact and positioning prongs extending generally parallel to each other from a generally intermediate portion of the stem in one direction, a pair of lead elements extending generally parallel to each other from opposite ends of the stem, and a runner for each terminal members. These terminal members are continued from the metal carrier strip through associated runners each extending between the metal carrier strip and the stem of the corresponding terminal member to keep the latter sustained by the metal carrier strip.

According to the present invention, single dies are sufficient to make the terminal members that can be trimmed to suit to a particular type of cable connectors. An inventory of a single stock of terminal members is also sufficient before the terminal members are employed in the ribbon cable connectors. Both of these advantages therefore contribute to a substantial reduction in manufacturing cost.

BRIEF DESCRIPTION OF THE DRAWINGS

These and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENT

Figure 1:
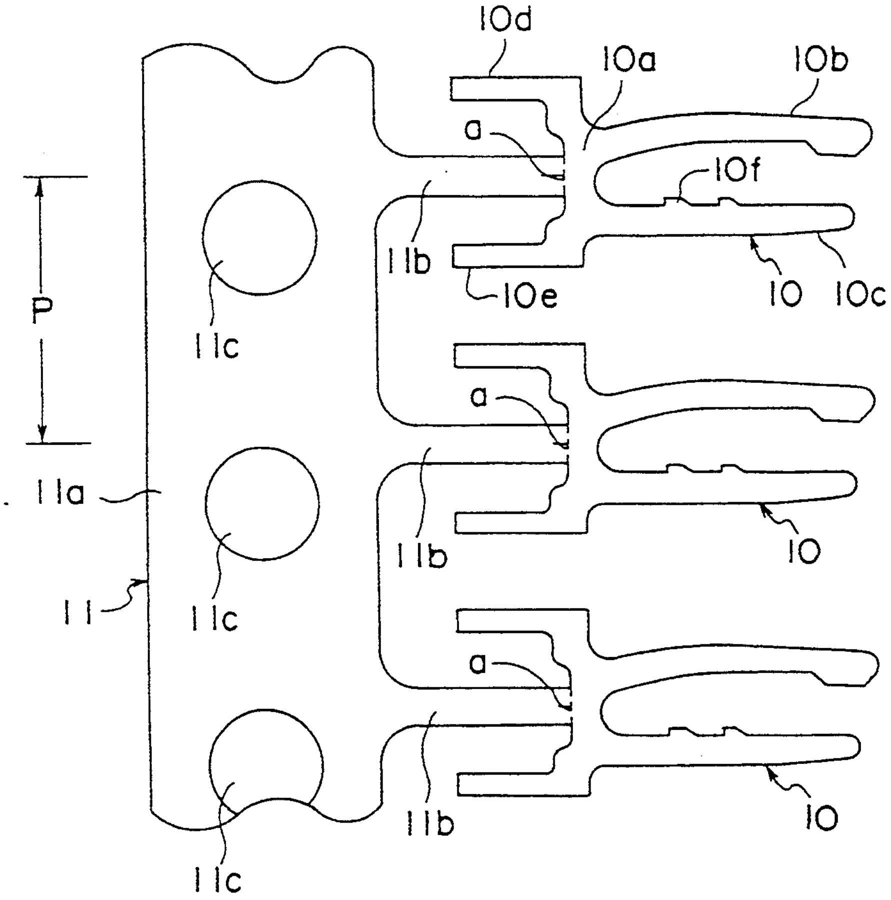
FIG. 1 is a fragmentary top plan view of a terminal array according to the present invention which has been formed by the use of a press work from a strip of rigid electroconductive material.

Referring first to FIG. 1, there is shown a single versatile bifurcated terminal member generally identified by 10. As shown therein, the terminal member comprises a generally elongated stem 10*a* having first and second side edges opposite to each other and also having first and second ends opposite to each other, contact and positioning prongs 10*b* and 10*c* integral with a generally intermediate portion of the elongated stem 10*a* and extending generally parallel to each other and generally transversely from the first side edge of the elongated stem 10*a* in one direction, and a pair of lead elements 10*d* and 10*e* integral with the opposite ends of the elongated stem and extending generally parallel to each other and substantially transversely from the second side edge of the elongated stem in a different direction counter to said one direction. The positioning prong 10*c* has one or more anchoring protuberances 10*f* formed integrally therewith so as to protrude towards the contact prong 10*b*.

One of the lead elements 10*b* and 10*c* of the versatile bifurcated terminal member 10 according to the present invention is adapted to be removed by trimming or cutting along an intended cut-line b or c from the elongated stem 10*a* depending on the type of ribbon cable connector in which the very terminal member 10 is to be mounted as will be discussed later.

Figure 2:
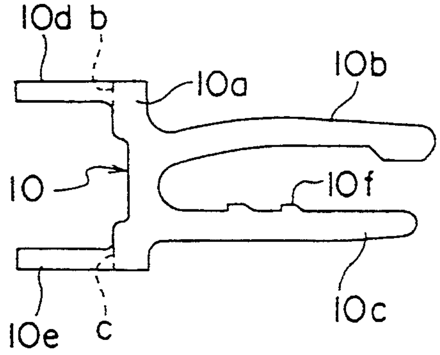
FIG. 2 is a top plan view of a versatile bifurcated terminal member according to the present invention.

Referring now to FIG. 1, the terminal member 10 of the structure shown in and described with reference to FIG. 2 is one of identical terminal members separated from a terminal array shown therein. This terminal array is prepared from a strip of electroconductive material, for example, a sheet metal 11 by the use of any known press work and comprises a metal carrier strip 11*a* having a plurality of straight runners 11*b* spaced at intervals of a predetermined pitch P from each other generally over the length of the metal carrier strip 11*a* and extending transversely therefrom in one direction, and a series of generally bifurcated terminal members 10 equal in number to the number of the runners 11*b* and connected integrally with the metal carrier strip 11*a* through the respective runners 11*b*.

The terminal array shown in FIG. 1 may be punched or blanked using a known press machine combined or synchronously coupled with a strip feeder (not shown) for feeding a strip of metal sheet intermittently, but in synchronism with the controlled operation of the press machine and, for this purpose, the metal carrier strip 11*a* is shown to have a series of longitudinally equally spaced feed perforations 11*c* with which feed pawls, forming integral parts of the strip feeder, are drivingly engaged.

In the terminal array as manufactured, each terminal member 10 connected with the metal carrier strip 11*a* by means of the respective runner 11*a* extending from the metal carrier strip 11*a* and terminating in continuation with a substantially intermediate portion of the elongated stem 10*a*. When the terminal members 10 are ready to be installed in a connector housing in a manner as will be described later, the terminal members 10 are separated from the metal carrier strip 11*a* by trimming or cutting along an intended cut-line a which is preferably aligned with the second side edge of each terminal member 10.

If, however, an ultimate ribbon cable connector of a type other than the types discussed later so requires, a portion of each runner 11*b* used to connect the respective terminal member 10 with the metal carrier strip 11*a* may be utilized as a lead element, similar in function to any one of the lead elements 10*d* and 10*e*, or a mounting leg by which the ribbon cable connector is secured on a support surface, for example, a printed circuit board or a structural element. In such case, each terminal member 10 may be separated from the metal carrier strip 11*a* by trimming or cutting a generally intermediate portion of the respective runner 11*b* transversely, leaving the separated terminal member 10 having three lead elements or the mounting leg in addition to the lead elements 10*d* and 10*e*.

Figure 3A:
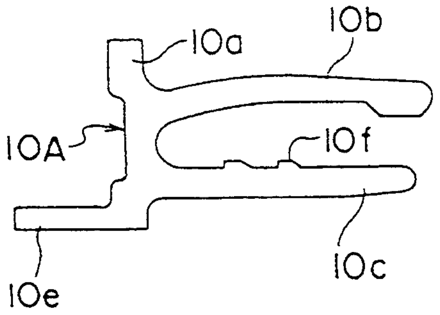
FIGS. 3(A) to 3(C) are top plan views showing the terminal members are trimmed to suit different types of ribbon cable connectors/respectively.
Figure 3B:
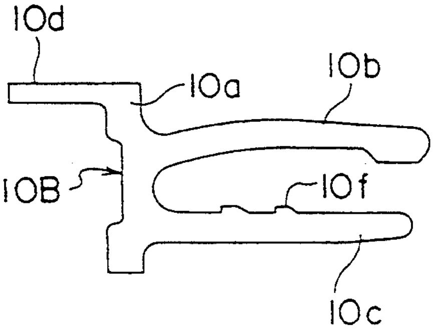
Figure 3C:
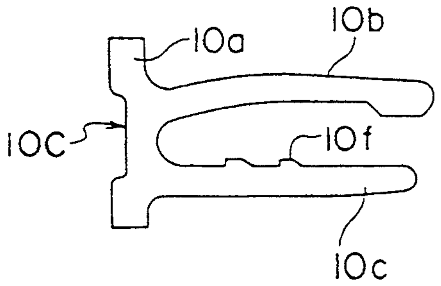

While the terminal member 10 shown in FIG. 2 is a versatile design, this versatile design is modified to represent such a shape as shown by 10A in FIG. 3(A) when the terminal member 10 is to be used in the connector housing for the top-contact model of the right-angled ribbon cable connector; by 10B in FIG. 3(B) when the terminal member 10 is to be used in the connector housing for the bottom-contact model of the right-angled ribbon cable connector; or by 10C in FIG. 3(C) when the terminal member 10 is to be used in the connector housing for the straight ribbon cable connector. As a matter of course, a transformation from the versatile design into the particular shape shown in any one of FIGS. 3(A) to 3(C) can readily and simply be accomplished by removing one or both of the lead elements **10*d* and 10*e*** in the manner described hereinbefore.

As shown in FIGS. 3(A)–3(C), in the case of the top-contact model of the right-angled ribbon cable connector, only the lead element **10*e* remote from the contact prong 10*b* and adjacent the positioning prong 10*c* is utilized; in the case of the bottom-contact model thereof, only the lead element 10*d* adjacent the contact prong 10*b* and remote from the positioning prong 10*c* is utilized; and in the case of the straight ribbon cable connector, both of the lead elements 10*d* and 10*e*** are removed.

An actual cutting of one or both of the lead elements **10*d* and 10*e* may be carried out simultaneously with the separation of the terminal members 10 from the metal carrier strip 11*c*** generally at the end of or subsequent to the punching or blanking process, or during a trimming process which may take place in the course of an automatic insertion of terminal members successively into the respective connector housing.

Figure 4:
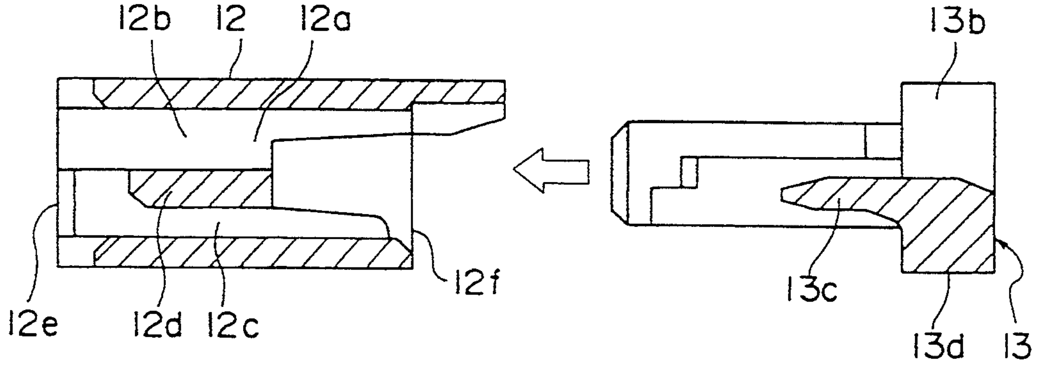
FIG. 4 is a schematic transverse sectional view showing the ribbon cable connector utilizable with the terminal members of the present invention.
Figure 5:
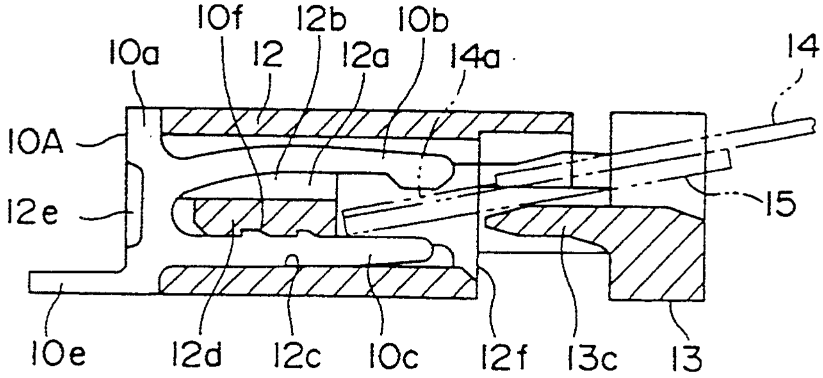
FIG. 5 is a schematic transverse sectional view of the ribbon cable connector showing the manner in which a flexible ribbon cable is inserted for engagement with the terminal members employed therein.
Figure 9:
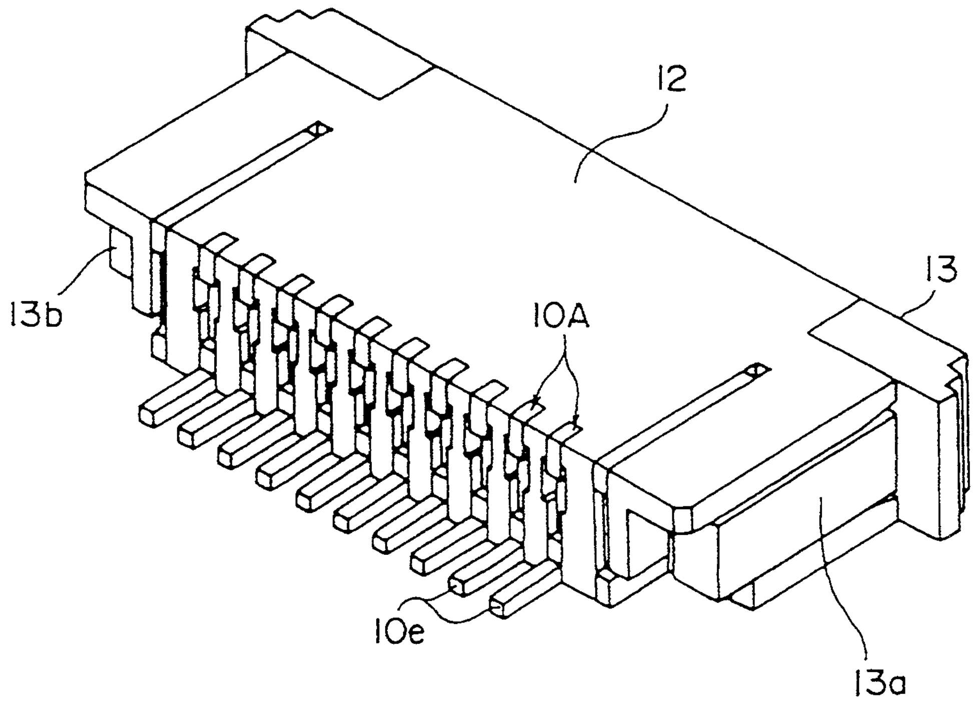
FIG. 9 is a perspective view of the top contact model of the right-angled ribbon cable connector.

Considering that the terminal members 10 separated from the metal carrier strip **11*c* remain of the same shape regardless of the presence or absence of one or both of the lead elements 10*d* and 10*e*, the connector housing, which will be described subsequently, does also remain of the same structure for all types of the ribbon cable connector. Referring now to FIGS. 4, 5 and 9, the connector housing is of two-piece construction including a generally rectangular box-like casing 12 and a lock-on insert 12**, both made of electrically insulating synthetic resins by the use of any known plastics molding technique.

The rectangular box-like casing 12 has at least one transverse row of a plurality of juxtaposed and equally spaced slit-like passageways **12*a* each opening generally from a front face 12*f* to a rear face 12*e* in a direction transverse to the longitudinal sense of the casing 12. Each of said slit-like passageways 12 is divided by means of a respective partition wall 12*d* into contact and positioning grooves 12*b* and 12*c* positioned one above the other as viewed in FIGS. 4 and 5**.

The lock-on insert 13 is of one-piece construction including a generally rectangular cover-up body **13*d* having its opposite ends integrally formed with elastically yieldable catch arms 13*a* and 13*b* extending transversely therefrom so that, when the lock-on insert 13 is mounted on the casing 12 as will be described later, the catch arms 13*a* and 13*b* embrace the casing 12 with the lock-on insert 13 consequently held in position to close a front opening of the casing 12 as best shown in FIG. 9. This rectangular cover-up body 13*d* also has a generally rectangular lock-on plug 13*c* formed integrally therewith and positioned between the catch arms 13*a* and 13*b* so as to protrude and taper in a direction conforming to the direction in which the catch arms 13*a* and 13*b* protrude. When the lock-on insert 13 is mounted on the casing 13, the lock-on plug 13*c* is plugged into the front opening of the casing 12, not only is the front opening of the casing closed completely, but a front end portion of the flexible ribbon cable, identified by 14 in FIG. 5**, is clamped and held undetachable in a manner as will be described later.

It is to be noted that, since the details of the cable connector housing do not constitute subject matter of the present invention and may be had from various literatures, for example, the initially referenced related U.S. application by the same inventor, the further details thereof will not be reiterated for the sake of brevity.

The shaped terminal members 10 are accommodated in the casing 12 with the contact and positioning prongs **10*b* and 10*c* inserted into the associated passageways 12*a* from the rear face 12*e*. As a matter of design, as the terminal members 10 are inserted into the passageways 12*a* in the casing 12 from the rear face 12*e*, the contact and positioning prongs 10*b* and 10*c* are substantially press-fitted into the contact and positioning grooves 12*b* and 12*c* with the anchoring protuberances 10*f* wedged into the partition walls 12*d* thereby to render the terminal members 10 to be substantially non-detachable relative to the casing 12, as best shown in FIG. 5**.

The lock-on insert 13 is, after the front end portion of the flexible ribbon cable 14 has been inserted into the front opening of the casing, plugged into the casing 12. Prior to the insertion of the flexible ribbon cable 14, the front end portion of the flexible ribbon cable 14 must be stripped off to expose electric conductors as indicated by **14*a***. This can readily be accomplished by stripping corresponding portions of flexible insulating films which are used to sandwich the parallel electric conductors to complete the flexible ribbon cable.

It should be noted that, in stripping off the front end portion of the flexible ribbon cable 14, that front end portion of the flexible ribbon cable 14 need not necessarily be stripped off in its entirety and may be partially stripped off only at such a region where, when the front end portion thereof is inserted into the casing, the electric conductors are brought into alignment with the contact prongs **12*b* of the terminal members 10**. For example, in the case of the top-contact model, only an upper region of the front end portion of the flexible ribbon cable may be stripped off. Alternatively, only a front end portion of one of the flexible insulating films sandwiching the parallel electric conductors may be stripped off.

In either case, prior to or subsequent to the stripping of the front end portion of the flexible ribbon cable 14, an electrically insulating backup plate 15 is bonded to, or otherwise fusion-bonded to the front end portion of the flexible ribbon cable 14 opposite to the region through which the electric conductors are exposed. Although the use of the backup plate 15 is not always essential, it is preferred to ensure a firm and reliable contact between the contract prongs **10*b* and the electric conductors forming the flexible ribbon cable 14**.

While the lock-on insert 13 is mounted substantially halfway on the casing 12 as shown with the catch arms **13*a* and 13*b* engaged in guide grooves on opposite ends of the casing 12, the front end portion of the flexible ribbon cable 14 is inserted into the casing 12 as shown by the phantom line in FIG. 5 together with the backup plate 15 through a transversely extending clearance between a front edge of a top wall of the casing 12 and the lock-on plug 13*c*, followed by a firm push of the lock-on insert 13 deep into the casing 12. When the lock-on insert 13 is completely mounted on the casing 12 in the manner described above, a surface region of the lock-on plug 13*c* which is in contact with the front end portion of the flexible ribbon cable urges the latter towards the contact prongs 10*b* with the bared electric conductors consequently brought into contact with the contact prongs 10*b***.

Figure 6:
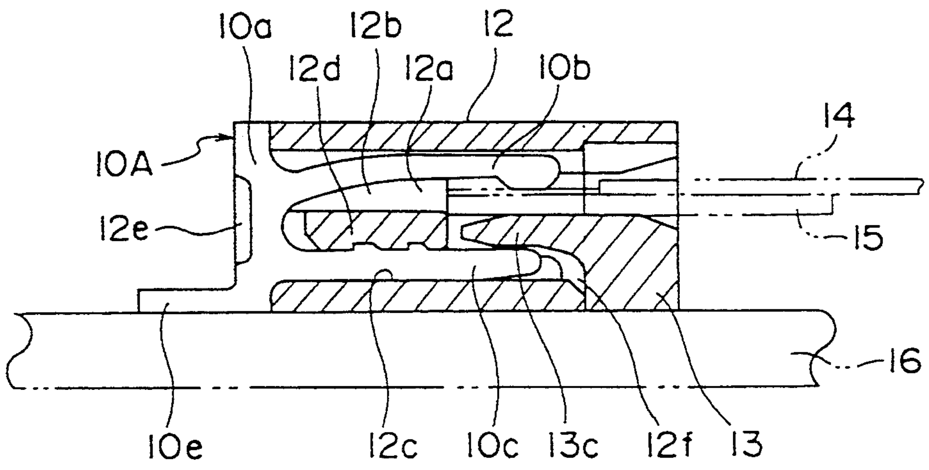
FIGS. 6 and 7 illustrate, in a schematic transverse sectional representation, top-contact and bottom-contact models of the right-angled ribbon cable connectors, respectively.

FIG. 6 illustrates the top-contact model of the right-angled flexible ribbon connector. In this model, the terminal members shown by 10A in FIG. 3(A) are employed, and the ribbon cable connector is stationarily mounted on, for example, a printed circuit board 16 with the lead elements **10*e* soldered to respective contact pads on the printed circuit board 16. In this instance, as the nomenclature denotes, the contact prongs 10*b* of the terminal members 10A** contact the bared electric conductors from top as viewed therein.

Figure 7:
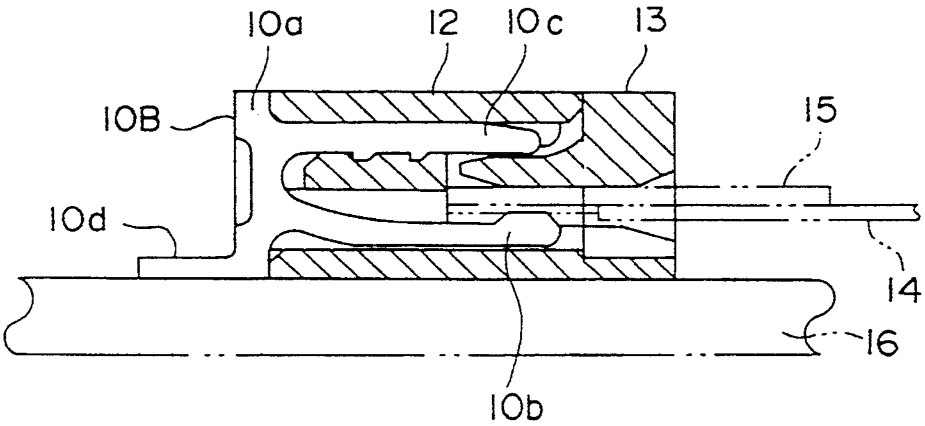

FIG. 7 illustrates the bottom-contact model of the right-angled flexible ribbon connector. In this model, the terminal members shown by 10B in FIG. 3(B) are employed, and the ribbon cable connector is stationarily mounted on, for example, a printed circuit board 16 with the lead elements **10*d* soldered to respective contact pads on the printed circuit board 16. In this instance, as the nomenclature denotes, the contact prongs 10*b* of the terminal members 10B contact the bared electric conductors from below as viewed therein. It is to be noted that the assembly of the connector housing 12 including the lock-on insert 13 is positioned in a sense opposite to that shown in FIG. 6**.

Figure 8:
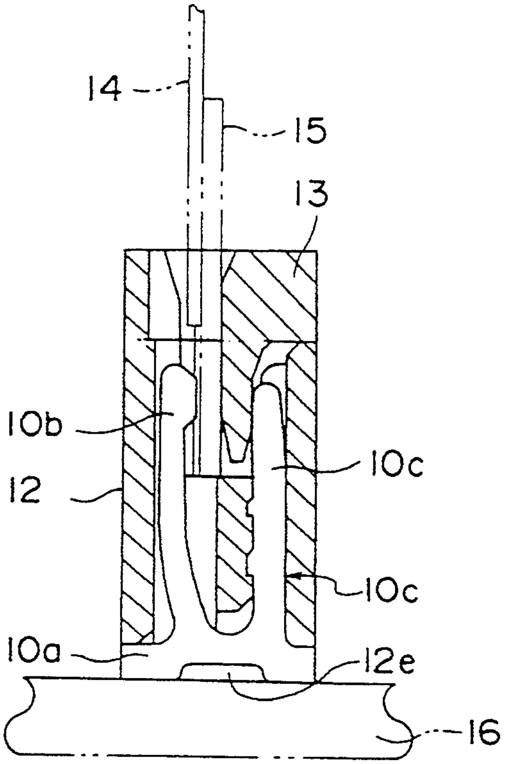
FIG. 8 illustrates, in a schematic transverse sectional representation, an straight ribbon cable connector.

FIG. 8 illustrates the straight type in which the terminal members shown by 10C in FIG. 3(C) are employed, and the ribbon cable connector is stationarily mounted upright with the opposite ends of the stems **10*a* soldered to the contact pads on the printed circuit 16. In this instance, the flexible ribbon cable 14 extends generally upwardly and perpendicular to the printed circuit board 16**.

So far as the three types of flexible cable connectors have been discussed, the prior art technique would require the use of three types of press dies. In contrast thereto, the present invention permits the versatile terminal members to be utilized in any type of flexible ribbon connector merely by trimming one or both of the lead elements and, therefore, the use of the single dies is sufficient to manufacture those versatile terminal members.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A generally bifurcated versatile terminal member of one-piece construction for use in a surface mounted flexible ribbon cable connector, which comprises:

a generally elongated stem, contact and positioning prongs extending generally parallel to each other from a generally intermediate portion of the stem in one direction; and a pair of lead elements for making electrical contact with a surface of another element, said pair of lead elements extending generally parallel to each other from opposite ends of the stem in a direction counter to said one direction, at least one of said lead elements being adapted to be trimmed off from the stem depending on the type of ribbon cable connector in which the versatile terminal member is to be mounted, so that when one of said lead elements is trimmed off, the contacting and positioning prongs may extend parallel to the surface of the other element with the other of said pair of lead elements contacting the surface of the other element, and when both of said pair of lead elements are trimmed off, the contacting and positioning prongs extend perpendicular to the surface of the other element with the stem contacting the surface of the other element.

2. A terminal array which comprises:

a metal carrier strip having a plurality of runners extending therefrom in one direction and spaced an equal distance from each other; and a series of generally bifurcated versatile terminal members for use in a surface mounted flexible ribbon cable connector and carried by said metal carrier strip at intervals of a predetermined pitch, each of said terminal members including a generally elongated stem, contact and positioning prongs extending generally parallel to each other from a generally intermediate portion of the stem in one direction, and a pair of lead elements for making electrical contact with a surface of another element, said pair of lead elements extending generally parallel to each other from opposite ends of the stem in a direction counter to said one direction, at least one of said lead elements being adapted to be trimmed off from the stem depending on the type of ribbon cable connector which the versatile terminal member is to be mounted, each said terminal member being carried by the metal carrier strip through the respective runner which extends between the metal carrier strip and the stem, so that when one of said lead elements is trimmed off, the contacting and positioning prongs may extend parallel to the surface of the other element with the other of said pair of lead elements contacting the surface of the other element, and when both of said pair of lead elements are trimmed off, the contacting and positioning prongs extend perpendicular to the surface of the other element with the stem contacting the surface of the other element.

3. The terminal array as claimed in claim 2, wherein said metal carrier strip has a series of feed perforation defined therein and spaced an equal distance from each other for engagement with a carrier feed means.

* * * * *